United States Patent [19]

Stern

[11] Patent Number: 4,840,701

[45] Date of Patent: Jun. 20, 1989

[54] ETCHING APPARATUS AND METHOD

[75] Inventor: Ronald C. Stern, Hoddesdon, Great Britain

[73] Assignee: STC PLC, London, England

[21] Appl. No.: 210,333

[22] Filed: Jun. 23, 1988

[30] Foreign Application Priority Data

Aug. 14, 1987 [GB] United Kingdom ................ 8719306

[51] Int. Cl.⁴ ...................... H01L 21/306; B44C 1/22; C03C 15/00; C03C 25/06
[52] U.S. Cl. .................................... 156/637; 156/646; 156/647; 156/657; 156/659.1; 156/662; 156/345; 252/79.5
[58] Field of Search ............... 156/637, 639, 646, 647, 156/657, 659.1, 662, 345; 252/79.5

[56] References Cited

U.S. PATENT DOCUMENTS

| 3,912,563 | 10/1975 | Tomioka et al. | 156/345 X |
| 4,251,317 | 2/1981 | Foote | 156/345 X |
| 4,302,273 | 11/1981 | Howard | 156/345 |
| 4,675,067 | 6/1987 | Valley | 156/637 X |

Primary Examiner—William A. Powell
Attorney, Agent, or Firm—Lee & Smith

[57] ABSTRACT

An etching apparatus for the selective etching of e.g. single crystal silicon is described. The apparatus includes a tank for receiving a quantity of liquid etchant, the tank being provided with means for injecting oxygen, nitrogen or mixtures thereof into the etchant. Stirrers circulate the etchant around the bath. Gas injection has been found to improve the quality of the etched product and to provide control of the etching process.

8 Claims, 3 Drawing Sheets

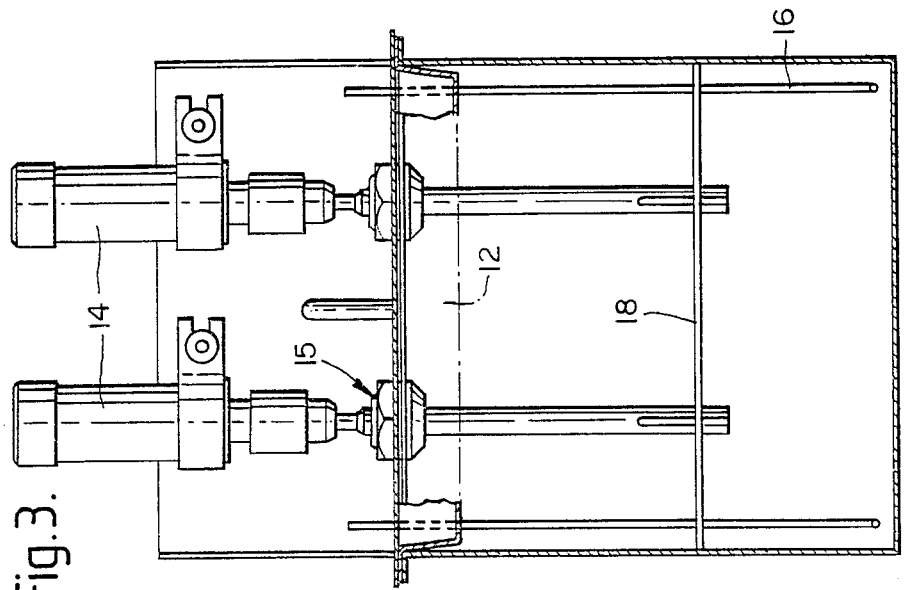
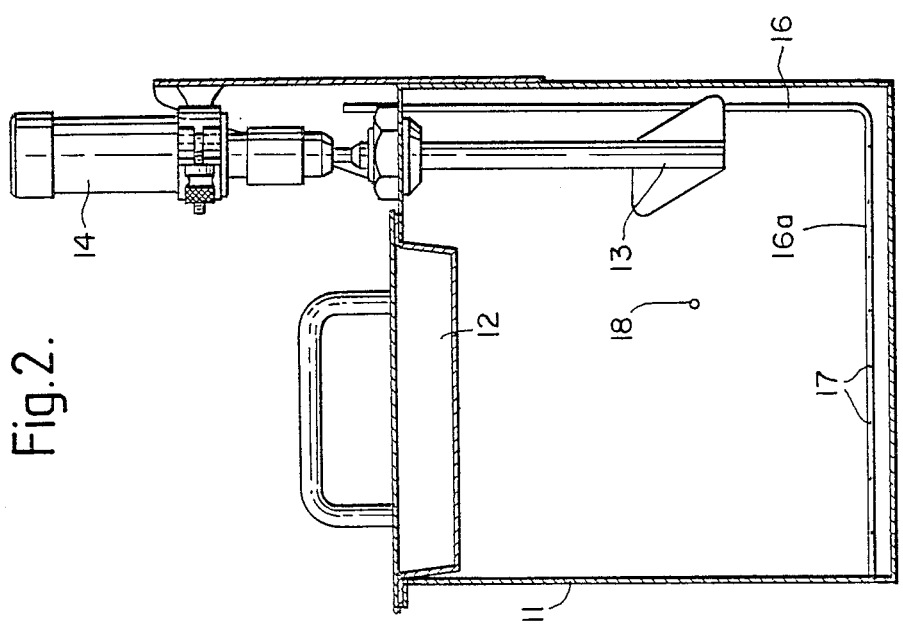

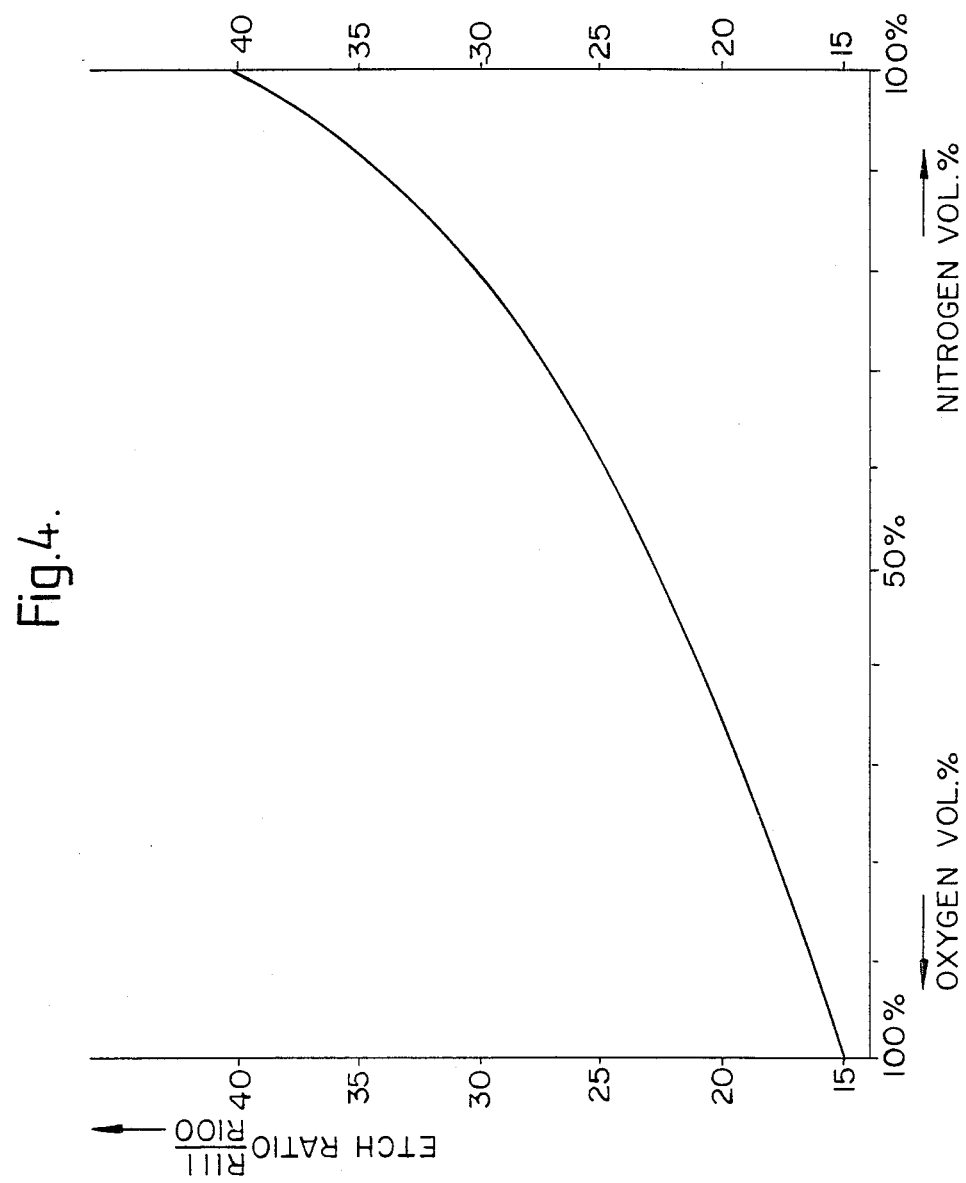

ETCHING APPARATUS AND METHOD

BACKGROUND OF THE INVENTION

This invention relates to an apparatus for liquid selective etching of a substrate, e.g. silicon, body and to a method of performing that etching.

Single crystal transducer structures, e.g. of selectively etched silicon, are finding increasing use in instrumentation applications where their ruggedness and small size are of particular advantage. These applications include the measurement of pressure, temperature and accelerational forces. The transducer structures comprise a unitary body formed by selective etching from a substrate body or blank of single crystal material. Conveniently, silicon is used for this purpose as it has excellent mechanical properties and is not unduly sensitive to changes in temperature. Typical examples of etched silicon transducers are described in our published UK specifications Nos. 2,130,373 and 2,139,358.

In a typical fabrication process, the transducer devices are configured in a substrate body either by means of a photolithographic mask or by selective boron doping, and a defined by exposure of the substrate to a selective anisotropic etch. Generally, potassium hydroxide (KOH) etches are employed, a typical etch comprising a mixture of, water, potassium hydroxide and isopropyl alcohol.

Prior to the present application, etching of transducer devices have been performed as a 'one off' process or individual substrate wafers. Attempts to adapt this process to the simultaneous etching of a plurality of wafers have met with a number of difficulties. In particular, lack of uniformity of etching prevents the strict process control that is necessary for volume manufacture. Also, it has been found that the process can suffer from a phenomenon known as pyramid formation. Pyramidal structures of unetched material extend from the etched surfaces of the substrate body and reduce the yield of usable devices. Furthermore, it has been found that boron etch stops are not always effective with conventional etching processes.

The object of the invention is to minimise or to overcome these disadvantages.

SUMMARY OF THE INVENTION

According to one aspect of the invention there is provided a liquid etching apparatus, including a sealable container for receiving a quantity of liquid etchant and having means for mounting a plurality of single crystal semiconductor substrates in contact with the etchant, means for circulating and mixing the etchant within the container, and means for injecting oxygen, an inert gas or mixtures thereof into the etchant adjacent the semiconductor substrates.

According to another aspect of the invention there is provided a method of etching a single crystal semiconductor substrate, the method including exposing a selected region of the substrate to a liquid etch, agitating the etchant adjacent the substrate, and injecting oxygen, an inert gas or mixtures thereof into the etchant adjacent the substrate thereby achieving uniform etching of the substrate.

Preferably the semiconductor is silicon and the liquid etch is a mixture of water potassium hydroxide (KOH) and isopropanol. However, it will be appreciated that other etches, e.g. hydrazine hydrate, may also be employed. We prefer to employ nitrogen as the inert gas, but other gases such as argon may also be used.

The technique has been found to provide uniformity of simultaneous etching of a plurality of wafers each being an array of devices.

BRIEF DESCRIPTION OF THE DRAWINGS

An embodiment of the invention will now be described with reference to the accompanying drawings in which:

FIGS. 2 and 3 are sectional views of the apparatus of FIG. 1.

and FIG. 4 illustrates the relationship between the etch ratio in two crystallographic directions and injected gas composition.

DESCRIPTION OF PREFERRED EMBODIMENTS

Figure 1:
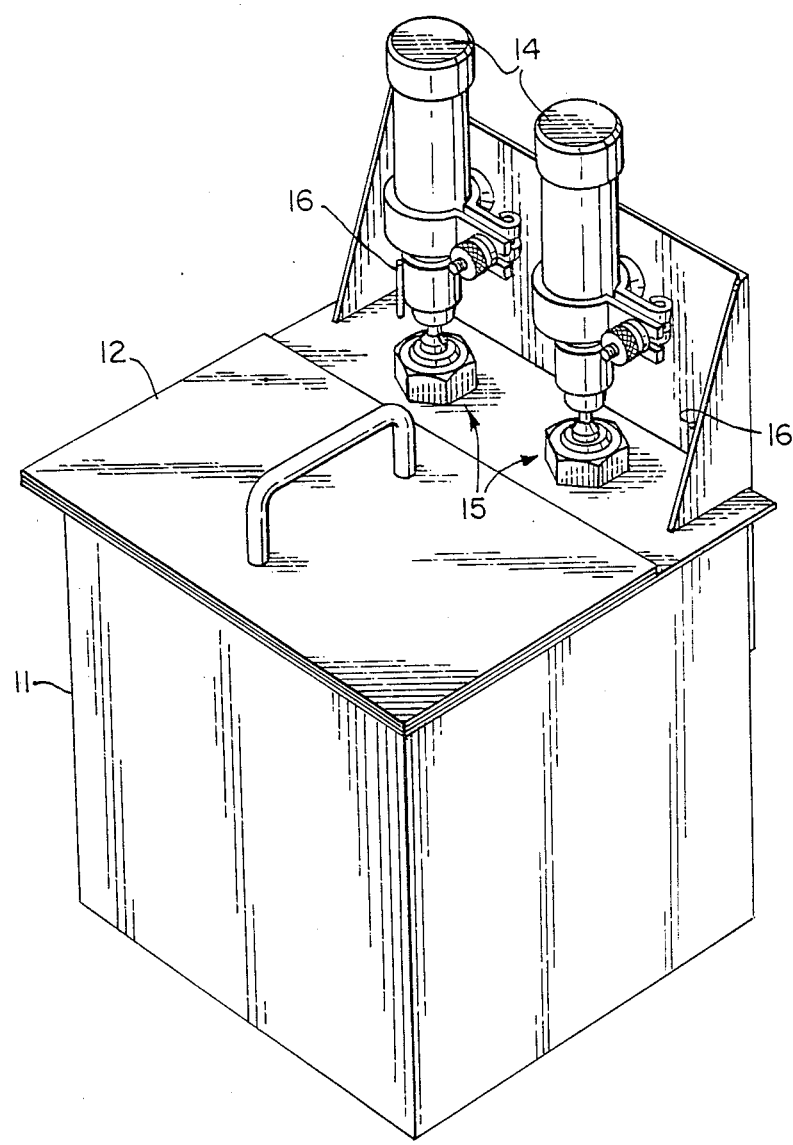
FIG. 1 is a general view of the etching apparatus.

Referring to the drawings, the apparatus includes a tank 11 for receiving a quantity of liquid etchant and provided with an access opening which, in use, is sealed with a removable lid 12.

Advantageously, the lid 12 is water cooled so as to minimise loss of the etchant by evaporation. Agitation or circulation of the etchant is effected by stirrers 13 each driven by a respective pneumatic motor 14 via a PTFE gland 15 mounted in the upper surface of the tank 11. Preferably the tank 11 and lid 12 are made of stainless steel.

Gas is supplied to the tank 11 via inlet pipes 16 each of which has a limb 16a adjacent the base of the tank and provided with a plurality of openings 17 whereby, in use, gas is distributed throughout the etchant contained in the tank. Supports 18 are provided within the tank 11 whereby a carrier (not shown) may be mounted for receiving a plurality of wafers to be processed. The arrangement is such that wafers are in contact with liquid etchant constantly recirculated by the stirrers 13 and are exposed to a continuous stream of gas bubbles from the gas inlet pipes 16.

We prefer to employ oxygen, nitrogen or mixtures thereof as the inlet gas supplied to the tank. The mechanism by which this gas affects the etching process is not fully understood, but we have found that the injection of gas provides a significant improvement in the etching process. In particular, gas injection results in uniformity of etching of a plurality of wafers.

Further injection of gas may, with advantage, be provided by the stirrers 13 which may each be operated with sufficient speed to induce a vortex in the etchant. This vortex drags gas from an airspace above the liquid down towards the base of the tank. In the process the gas is thoroughly dispersed in the form of small bubbles which are circulated around the tank.

We have found that the gases mentioned above have different effects on the etching process. For example, at a temperature of 60° C. the inclusion of air in the etchant liquid reduces pyramid formation to a very low level. Using a potassium hydroxide/isopropyl alcohol anisotropic etch the ratio of etching rates in the (100) and (111) direction is typically 27:1. The injection of nitrogen increases the etch ratio to about 30:1. A consequent increase in pyramid formation may be countered by increasing the concentration of potassium hydroxide in the etchant from the usual 20% to 40% wt/vol. In addition, nitrogen has been found to inhibit unwanted etching of boron doped regions. Oxygen reduces the etch ratio to 15:1, although this is still acceptable for most applications. No pyramid formation occurs and the etched surface has been found to be very smooth. For most applications a mixture of oxygen and nitrogen is employed to obtain a trade-off between the etch ratio and the quality of the etched surface. We have found that, for KOH concentrations above 25%, the etch composition has little effect on the etch ratio. We thus prefer to employ potassium hydroxide concentrations of 25% or more. Where high etch ratios are required we employ nitrogen as the injected gas and increase the temperature of the etchant. Thus, for example, at 80° C., the etch ratio using nitrogen injection is 60:1.

FIG. 4 illustrates the effect of gas composition on etch ratio for component mixtures of oxygen and nitrogen at a temperature of 60° C. The etch employed was a mixture of water potassium hydroxide and isopropanol. As can be seen from FIG. 4, the R111/R100 etch ratio can be adjusted to any desired value between 15 and 40 merely by corresponding control of the gas composition. This facility is of value in specialised applications where a particular device geometry is required.

The following Example illustrates the invention.

EXAMPLE

An array of device areas was defined by masking a 4 inch single crystal silicon wafer. Each device included a disc shaped area to be thinned by etching to define a diaphragm. The wafer was placed in the etching bath described above and was etched in an etchant comprising 2400 g potassium hydroxide, 6 liter water and 2 liter isopropyl alcohol. Nitrogen was injected at a flow rate of 1 liter/minute. The bath temperature was 60° C. The stirrers were driven at 950 revs/minute.

A uniform etch rate across the entire wafer of 16 microns/hour was observed. The R100/R111 etch ratio was measured at 40:1 thus providing a very effective anisotropy of etching.

This Example demonstrates the feasibility of the process and apparatus described above in the etching of silicon wafers to form silicon transducers.

The apparatus and process described herein are of particular application in the fabrication of electromechanical transducer devices. However they are not limited to this application and may thus be employed in the fabrication of other semiconductor structures.

I claim:

1. A liquid etching apparatus, including a sealable container for receiving a quantity of liquid etchant and having means for mounting a plurality of single crystal semiconductor substrates in contact with the etchant, means for circulating and mixing the etchant within the container, and means for injecting oxygen, an inert gas or mixtures thereof into the etchant adjacent the semiconductor substrates.

2. A liquid etching apparatus as claimed in claim 1, wherein said circulating and mixing means comprises one or more stirrer whereby, in use, vortices are formed in the etchant such that gas is drawn from the etchant surface into the etchant.

3. A liquid etching apparatus as claimed in claim 2, wherein cooling means is provided for condensing evaporated etchant.

4. A method of etching a single crystal semiconductor substrate, the method including exposing a selected region of the substrate to a liquid etch, agitating the etchant adjacent the substrate, and injecting oxygen, an inert gas or mixtures thereof into the etchant adjacent the substrate thereby achieving uniform etching of the substrate.

5. A method as claimed in claim 4 wherein the semiconductor is silicon.

6. A method as claimed in claim 5, wherein the etchant is a mixture of water potassium hydroxide and isopropanol.

7. A method as claimed in claim 6 wherein the potassium hydroxide concentrate in the etchant is at least 25% wt/vol.

8. A method as claimed in claim 7, wherein the inert gas is nitrogen.

* * * * *